(12) United States Patent
Watanabe et al.

(10) Patent No.: US 10,217,684 B2
(45) Date of Patent: Feb. 26, 2019

(54) RESIN MOLDING AND SENSOR DEVICE

(71) Applicant: Hitachi Automotive Systems, Ltd., Hitachinaka-shi, Ibaraki (JP)

(72) Inventors: Tsubasa Watanabe, Tokyo (JP); Tsutomu Kono, Tokyo (JP); Takayuki Yogo, Hitachinaka (JP); Hiroaki Hoshika, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/576,356

(22) PCT Filed: Jun. 14, 2016

(86) PCT No.: PCT/JP2016/067629
§ 371 (c)(1),
(2) Date: Nov. 22, 2017

(87) PCT Pub. No.: WO2017/056572
PCT Pub. Date: Apr. 6, 2017

(65) Prior Publication Data
US 2018/0158743 A1 Jun. 7, 2018

(30) Foreign Application Priority Data

Sep. 30, 2015 (JP) .................................. 2015-193796

(51) Int. Cl.
*H01L 27/14* (2006.01)
*H01L 23/10* (2006.01)
(Continued)

(52) U.S. Cl.
CPC ........ *H01L 23/10* (2013.01); *B29C 45/14639* (2013.01); *G01F 1/684* (2013.01);
(Continued)

(58) Field of Classification Search
CPC . H01L 23/10; H01L 23/5383; H01L 23/3121; H01L 24/48; H01L 23/5386;
(Continued)

(56) References Cited

U.S. PATENT DOCUMENTS 7,852,634 B2 * 12/2010 Sakamoto ............. H01L 21/568
361/761
7,902,826 B2 * 3/2011 Yin ..................... G01R 33/3858
324/318

(Continued)

FOREIGN PATENT DOCUMENTS

AU 2012202644 A1 11/2012
EP 3176543 A1 6/2017
(Continued)

OTHER PUBLICATIONS

International Search Report (PCT/ISA/210) issued in PCT Application No. PCT/JP2016/067629 dated Sep. 13, 2016 with English translation (3 pages).

(Continued)

*Primary Examiner* — Stephen Bradley
*Assistant Examiner* — Wasiul Haider
(74) *Attorney, Agent, or Firm* — Crowell & Moring LLP

(57) ABSTRACT

A resin molding includes a semiconductor element, a circuit board, and a resin. A conductor connected to the semiconductor element is formed on the circuit board. The resin is adhered and integrated with the circuit board. A resin leakage suppression layer including a material having a higher thermal conductivity than that of a material forming a surface layer of the circuit board is provided in an edge region extending along a portion adhered to the resin in the circuit board and extending along at least one-side side surface of the resin.

12 Claims, 18 Drawing Sheets

(51) Int. Cl.

| | | |
|---|---|---|
| *G01F 1/684* | (2006.01) | |
| *G01F 1/692* | (2006.01) | |
| *H01L 23/28* | (2006.01) | |
| *H05K 1/02* | (2006.01) | |
| *B29C 45/14* | (2006.01) | |
| *H01L 21/48* | (2006.01) | |
| *H01L 21/52* | (2006.01) | |
| *H01L 21/56* | (2006.01) | |
| *H01L 23/04* | (2006.01) | |
| *H01L 23/13* | (2006.01) | |
| *H01L 23/31* | (2006.01) | |
| *H01L 23/538* | (2006.01) | |
| *H01L 25/16* | (2006.01) | |
| *F02D 41/18* | (2006.01) | |
| *H01L 23/00* | (2006.01) | |

(52) U.S. Cl.
CPC .......... *G01F 1/692* (2013.01); *H01L 21/4817* (2013.01); *H01L 21/52* (2013.01); *H01L 21/565* (2013.01); *H01L 23/041* (2013.01); *H01L 23/13* (2013.01); *H01L 23/28* (2013.01); *H01L 23/3121* (2013.01); *H01L 23/3185* (2013.01); *H01L 23/5383* (2013.01); *H01L 23/5386* (2013.01); *H01L 23/5389* (2013.01); *H01L 25/165* (2013.01); *H05K 1/02* (2013.01); *F02D 41/18* (2013.01); *G01F 1/6845* (2013.01); *H01L 24/32* (2013.01); *H01L 24/48* (2013.01); *H01L 24/73* (2013.01); *H01L 2224/32225* (2013.01); *H01L 2224/48091* (2013.01); *H01L 2224/48227* (2013.01); *H01L 2224/73265* (2013.01); *H01L 2924/1432* (2013.01); *H01L 2924/1434* (2013.01); *H01L 2924/15153* (2013.01); *H01L 2924/15192* (2013.01); *H01L 2924/181* (2013.01); *H01L 2924/19043* (2013.01); *H01L 2924/19105* (2013.01)

(58) Field of Classification Search
CPC . H01L 21/4817; H01L 23/5389; H01L 21/52; H01L 21/565; H01L 23/041; H01L 25/165; H01L 23/3185; G01F 1/692; B29C 45/14639
See application file for complete search history.

(56) References Cited

U.S. PATENT DOCUMENTS

| | | | |
|---|---|---|---|
| 9,554,464 B2 * | 1/2017 | Ohki | ............... H05K 1/0373 |
| 2011/0140211 A1 * | 6/2011 | Kono | ................ G01F 1/684 |
| | | | 257/415 |
| 2016/0113115 A1 * | 4/2016 | Kwon | ................ H05K 1/181 |
| | | | 361/679.26 |
| 2017/0115144 A1 | 4/2017 | Watanabe et al. | |

FOREIGN PATENT DOCUMENTS

| | | |
|---|---|---|
| EP | 3203194 A1 | 8/2017 |
| EP | 3225958 A1 | 10/2017 |
| JP | 6-45117 A | 2/1994 |
| JP | 2009-188086 A | 8/2009 |
| JP | 2010-169460 A | 8/2010 |
| JP | 2011-119500 A | 6/2011 |
| WO | WO 01/98736 A1 | 12/2001 |
| WO | WO 2016/017299 A1 | 2/2016 |

OTHER PUBLICATIONS

Japanese-language Written Opinion (PCT/ISA/237) issued in PCT Application No. PCT/JP2016/067629 dated Sep. 13, 2016 (4 pages).
European Office Action dated Dec. 19, 2018 (3 pages).

* cited by examiner

RESIN MOLDING AND SENSOR DEVICE

TECHNICAL FIELD

The present invention relates to a resin molding and a sensor device.

BACKGROUND ART

An internal combustion engine such as an automobile includes an electronically controlled fuel injection device for efficiently operating an internal combustion engine by appropriately adjusting the amount of air and fuel flowing into the internal combustion engine. The electronically controlled fuel injection device is provided with a flow rate sensor device for measuring a flow rate of the air flowing into the internal combustion engine.

The flow rate sensor device has a structure in which a flow rate sensor and a semiconductor element for control are mounted on a circuit board, and a semiconductor element is disposed in a space of a housing formed by a lower case and an upper cover. The flow rate sensor is exposed from the housing and is connected to the semiconductor element by wiring. The circuit board is fixed to the housing with an adhesive.

In the structure in which the circuit board is adhered to the housing, it takes time for applying and curing processes of the adhesive, and a throughput is lowered.

A rotary resistor is known which integrates a circuit board and a resin by insert molding. This rotary resistance is manufactured by the following method.

A ring-shaped O-ring is disposed on a circuit board, and the O-ring is pressed against the circuit board by a cylindrical core pin having a columnar hollow portion. To press the O-ring against the circuit board, a holding pin is slidably provided in the hollow portion of the core pin, the O-ring is fitted into the holding pin, the holding pin is projected from a tip of the core pin by energizing force of a spring, and the fitted O-ring is pressed against the circuit board. The O-ring is formed in a ring shape whose outer diameter is slightly larger than the core pin, and only the inner peripheral side is compressed by the core pin by leaving a part of the outer peripheral side of the O-ring. In this state, the resin is injected to the outer peripheral side of the core pin, and front and rear surfaces of the circuit board on the outer peripheral side of the core pin including the outer peripheral side from the core pin of the O-ring, are covered with resin. Then, the core pin is drawn out, and a rotating member is attached to the columnar space on the circuit board on which the core pin has been disposed. A lid as a holding member is attached to an upper surface of the rotating member. According to this structure, since the circuit board and the resin are integrated by insert molding, a throughput is improved. In addition, it is described that, since a gap between the rotating member and the circuit board is sealed by the O-ring, it is suppressed that the resin protrudes the upper surface side of the circuit board, and a resin burr is formed (for example, refer to PTL 1).

CITATION LIST

Patent Literature

PTL 1: JP H6-45117 A

SUMMARY OF INVENTION

Technical Problem

PTL 1 describes a method for manufacturing a resin molding in which a circuit board and a resin having a columnar space formed therein are integrated. However, according to the method described in PTL 1, a shape of the resin is limited to a structure having a columnar space. A resin molding which can use conventional insert molding which is not restricted in the shape of resin and can suppress resin leakage during molding is not disclosed.

Solution to Problem

According to a first embodiment of the present invention, a resin molding includes a semiconductor element, a circuit board, and a resin. A conductor connected to the semiconductor element is formed on the circuit board. The resin is adhered and integrated with the circuit board. A resin leakage suppression layer including a material having a higher thermal conductivity than that of a material forming a surface layer of the circuit board is provided in an edge region extending along a portion adhered to the resin in the circuit board and extending along at least one-side side surface of the resin.

According to a second embodiment of the present invention, in the sensor device, a semiconductor element in the resin molding is a sensor element.

Advantageous Effects of Invention

According to the present invention, it is possible to efficiently integrate a circuit board and a resin, and to improve a throughput. In addition, leakage of resin to the circuit board side can be suppressed by a resin leakage suppression layer.

BRIEF DESCRIPTION OF DRAWINGS

FIG. 6A is a view indicating a structure having a resin leakage suppression layer according to the present invention. FIG. 6B is a view indicating a conventional resin molding which does not include a resin leakage suppression layer.

DESCRIPTION OF EMBODIMENTS

Hereinafter, a sensor device having an intake air amount sensor mounted on an internal combustion engine of an automobile will be described as an example of an insert-molding using a circuit board.

The intake air amount sensor is a flow rate sensor that measures a flow rate of gas (air) and is installed for use in controlling an intake air amount by an electronically controlled fuel injection device mounted in the internal combustion engine. A sensor chip having a thin diaphragm is used in the intake air amount sensor, and measurement data on the sensor chip is collected and corrected by a control chip and outputted to the outside.

—First Embodiment—

Hereinafter, a first embodiment of the present invention will be described with reference to FIGS. 1 to 5.

Figure 1:
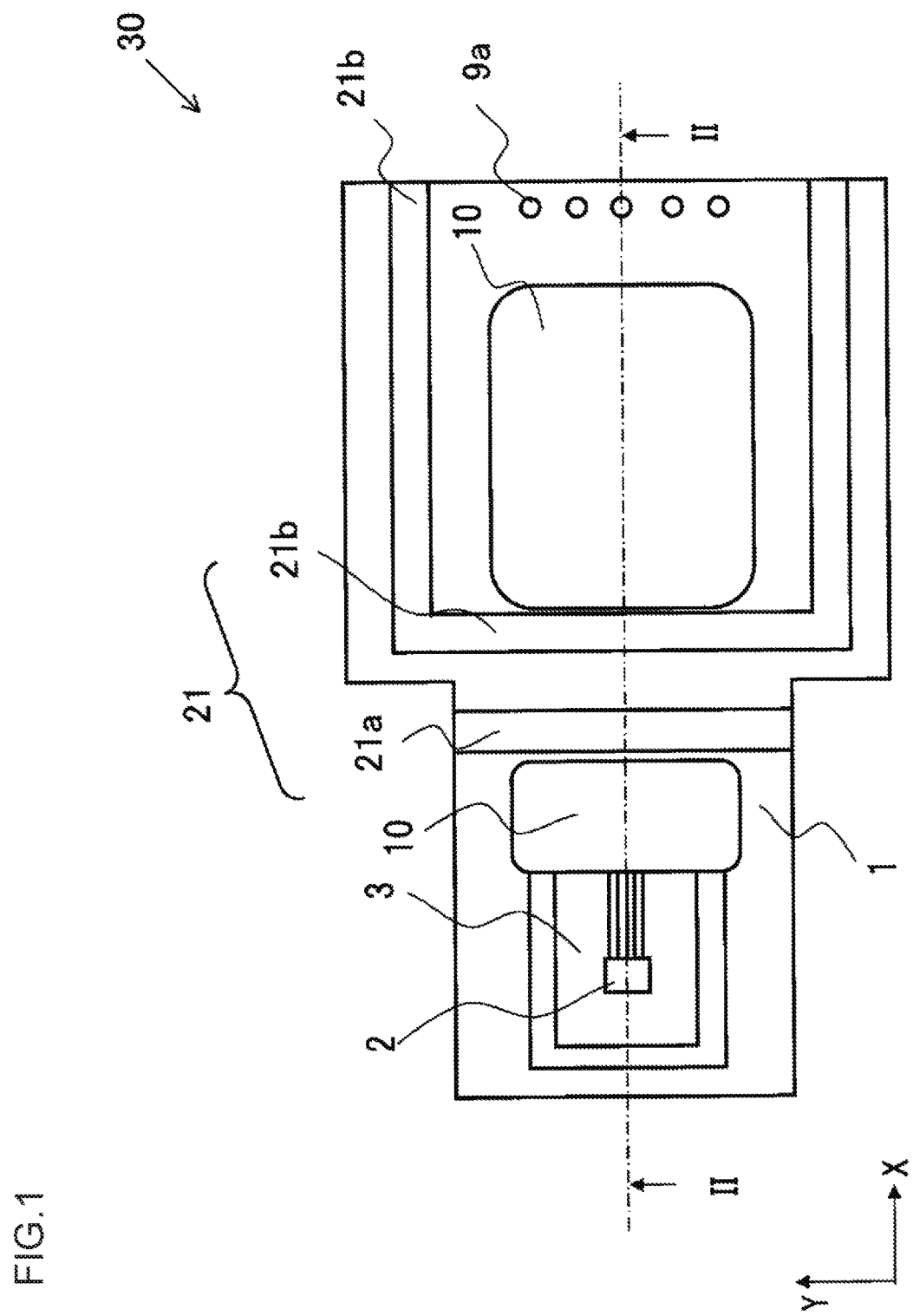
FIG. 1 is a plan view of a circuit module of a sensor device according to a first embodiment of the present invention.
Figure 2:
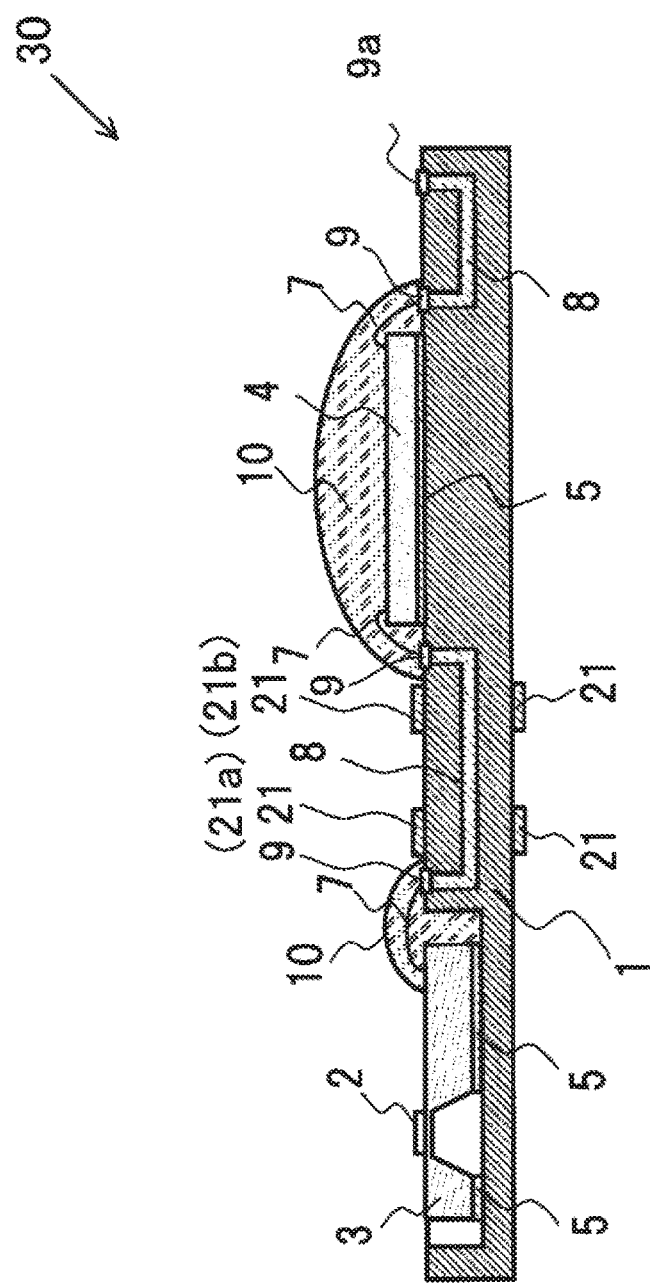
FIG. 2 is a cross-sectional view taken along line II-II of the circuit module illustrated in FIG. 1.
Figure 5:
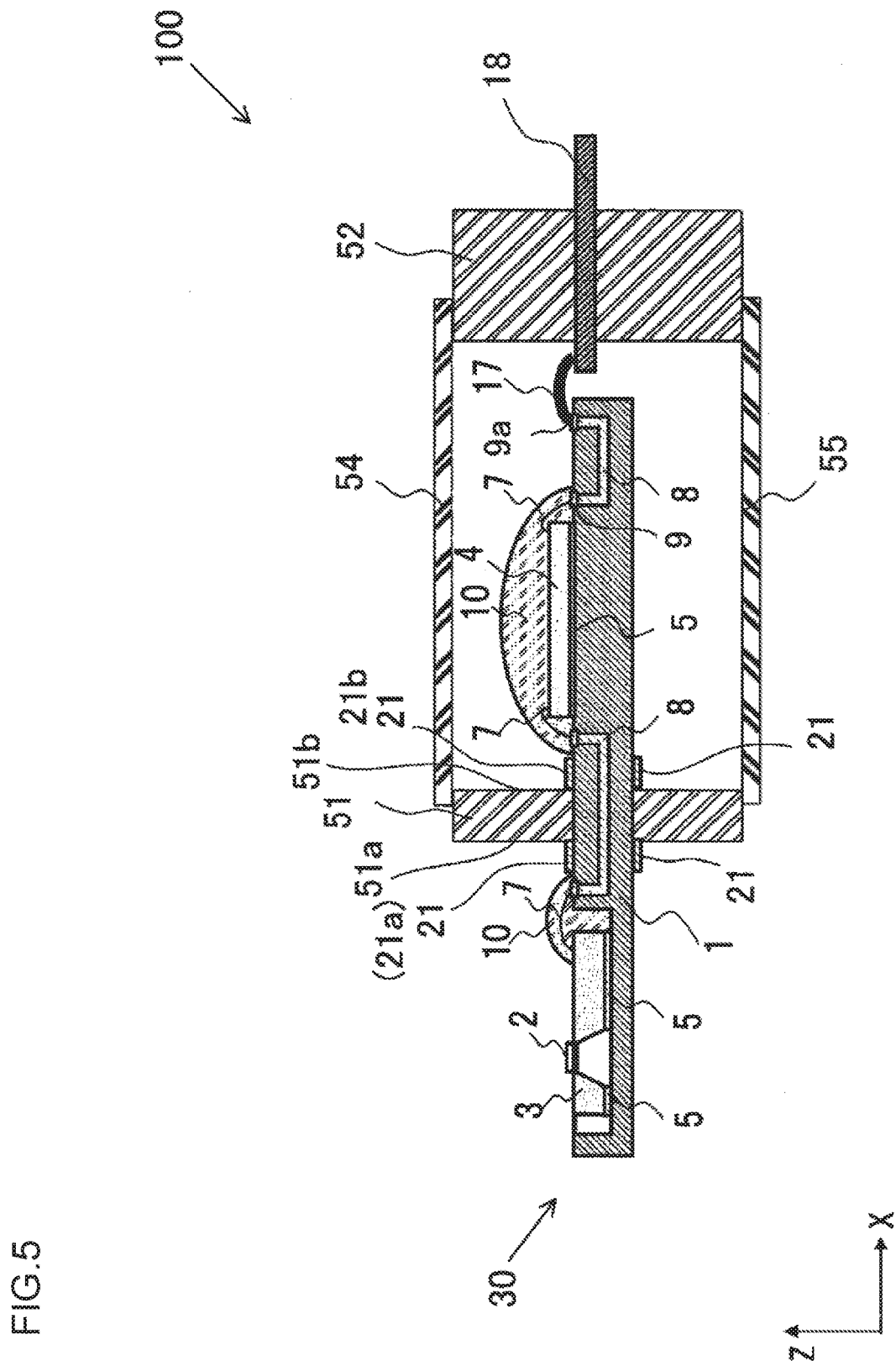
FIG. 5 is a cross-sectional view of a sensor device according to the first embodiment of the present invention.

FIG. 5 is a cross-sectional view of a sensor device according to the first embodiment of the present invention. FIG. 1 is a plan view of a circuit module included in the sensor device illustrated in FIG. 5. FIG. 2 is a cross-sectional view taken along line II-II of the circuit module illustrated in FIG. 1.

As illustrated in FIG. 5, a sensor device 100 integrates a circuit module 30 and a plurality of connector leads 18 with a resin 50 (refer to FIG. 4) by insert-molding using the circuit module 30 and the connector leads 18 as an insert product.

First, the circuit module 30 will be described.

In the following description, the X direction, the Y direction, and the Z direction are as indicated in each drawing.

As indicated in FIGS. 1 and 2, the circuit module 30 includes a circuit board 1, a first semiconductor element 3, a second semiconductor element 4, an inner layer wiring 8 including a conductor, and a resin leakage suppression layer 21.

The first semiconductor element 3 is a flow rate sensor element. The first semiconductor element 3 has a flow rate sensor unit 2 on the main surface side of a semiconductor substrate having a rectangular shape. The flow rate sensor unit 2 is formed on a diaphragm provided in the first semiconductor element 3. The diaphragm is a thin-walled region in which the semiconductor substrate is thinned by etching from a back surface side. Although not illustrated, on the diaphragm, a heating resistor and a plurality of control resistors are provided. A plurality of the resistors is disposed around the heating resistor and included in a bridge circuit. The flow rate sensor unit 2 detects a flow rate by utilizing the fact that the temperature of the control resistor rising due to gas heated by the heating resistor is related to a flow rate of the gas.

The circuit board 1 is formed by a multilayer wiring board and has the inner layer wiring 8 between wiring boards. Each wiring board is formed of, for example, a thermosetting resin such as a polyurethane resin such as an epoxy resin, or a thermoplastic resin such as polyimide or acrylic. Alternatively, the wiring board is formed of a base material containing fillers such as glass and silica in these resin materials. The circuit board 1 has a recessed portion in which the first semiconductor element 3 is stored. The first semiconductor element 3 is disposed in the recessed portion with the flow rate sensor unit 2 on an upper side and is adhered to a bottom surface of the recessed portion by an adhesive 5. The first semiconductor element 3 is bonded to a pad 9 provided on the circuit board 1 by a wire 7. The wire 7 is sealed with a sealing resin 10 formed by potting.

The second semiconductor element 4 has such as a CPU, an input circuit, an output circuit, and a memory and controls the flow rate sensor unit 2 so as to detect a gas flow rate. The second semiconductor element 4 is adhered to one surface of the circuit board 1 by the adhesive 5 and bonded to the pad 9 provided on the circuit board 1 by the wire 7. The second semiconductor element 4 is a bare chip, and an upper surface thereof is sealed with the sealing resin 10 formed by potting.

The adhesive 5 and the sealing resin 10 are formed of the same material as the circuit board 1.

The first semiconductor element 3 and the second semiconductor element 4 are connected by the inner layer wiring 8 via the pad 9. In addition, the second semiconductor element 4 is connected to an input/output pad 9a at a rear end in the X direction of the circuit board 1 by the inner layer wiring 8.

Figure 4:
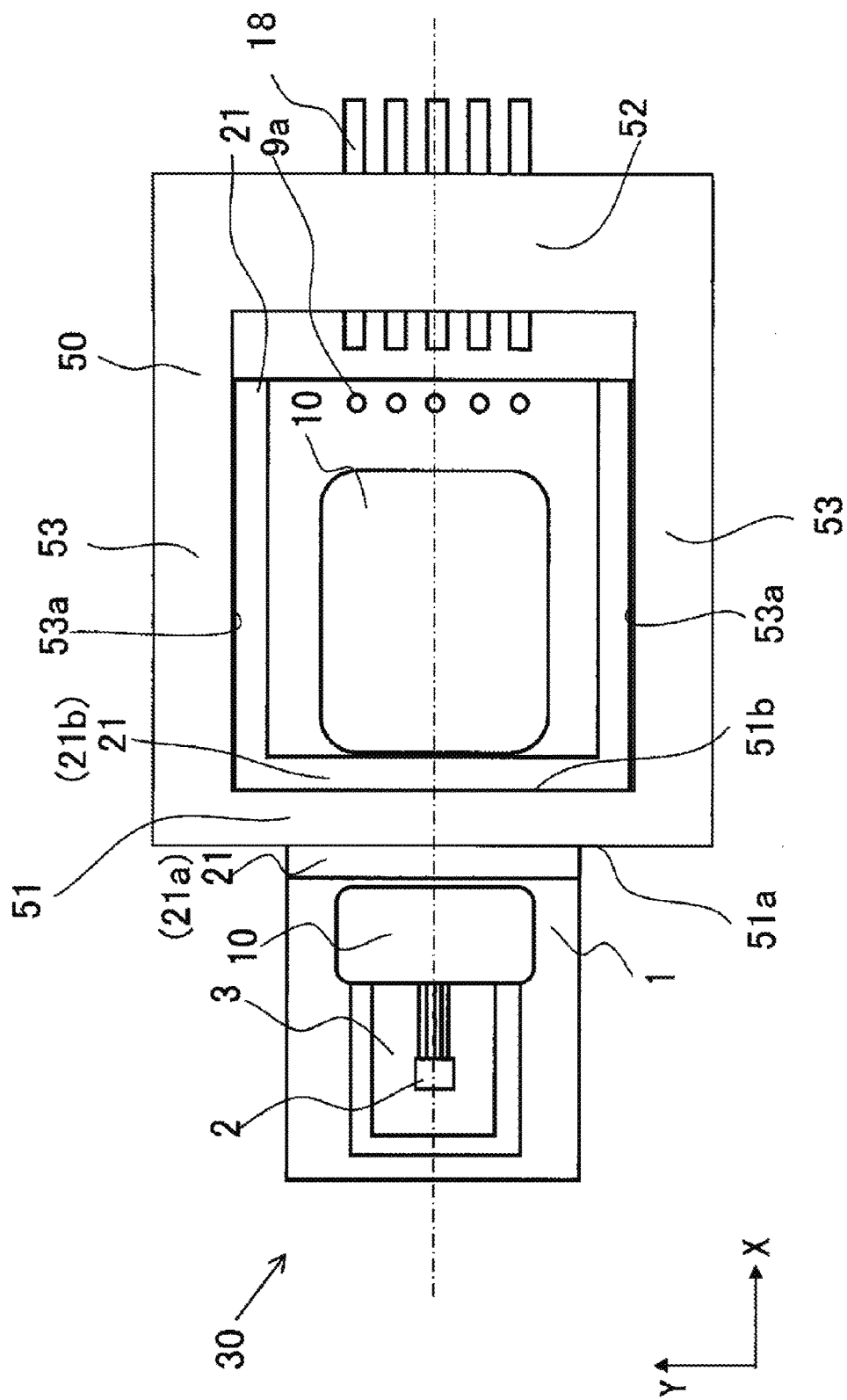
FIG. 4 is a plan view of a resin molding immediately after the circuit module illustrated in FIG. 1 is insert-molded.

On the upper and lower surfaces of the circuit board 1, a resin leakage suppression layer 21 is formed. As illustrated in FIG. 4, the resin 50 of the sensor device 100 includes a front wall portion 51, a rear wall portion 52, and a pair of intermediate wall portions 53 and is formed in a rectangular frame like. The front wall portion 51 is disposed on the front side in the X direction. The rear wall portion 52 is disposed on the rear side in the X direction. A pair of the intermediate wall portions 53 extends in the Y direction and connects the front wall portion 51 and the rear wall portion 52. The resin leakage suppression layer 21 provided on the upper surface of the circuit board 1 includes an outer edge portion 21a and an inner edge portion 21b. The outer edge portion 21a linearly extends in the Y direction on the front side in the X direction. The inner edge portion 21b is formed in a substantially U-shape on the rear side in the X direction. The resin leakage suppression layer 21 formed on the upper surface side of the circuit board 1 is formed along each of the outer side surface 51a and the inner side surface 51b of the front wall portion 51 of the resin 50 and the inner side surfaces 53a of a pair of the intermediate wall portions 53 of the resin 50. In addition, the resin leakage suppression layer 21 formed on the lower surface of the circuit board 1 is formed at a position facing the resin leakage suppression layer 21 formed on the upper surface side.

Next, a method for manufacturing the sensor device 100 in which the circuit module 30 and the resin 50 are integrated by insert-molding using this circuit module 30 as an insert product will be described.

Figure 3:
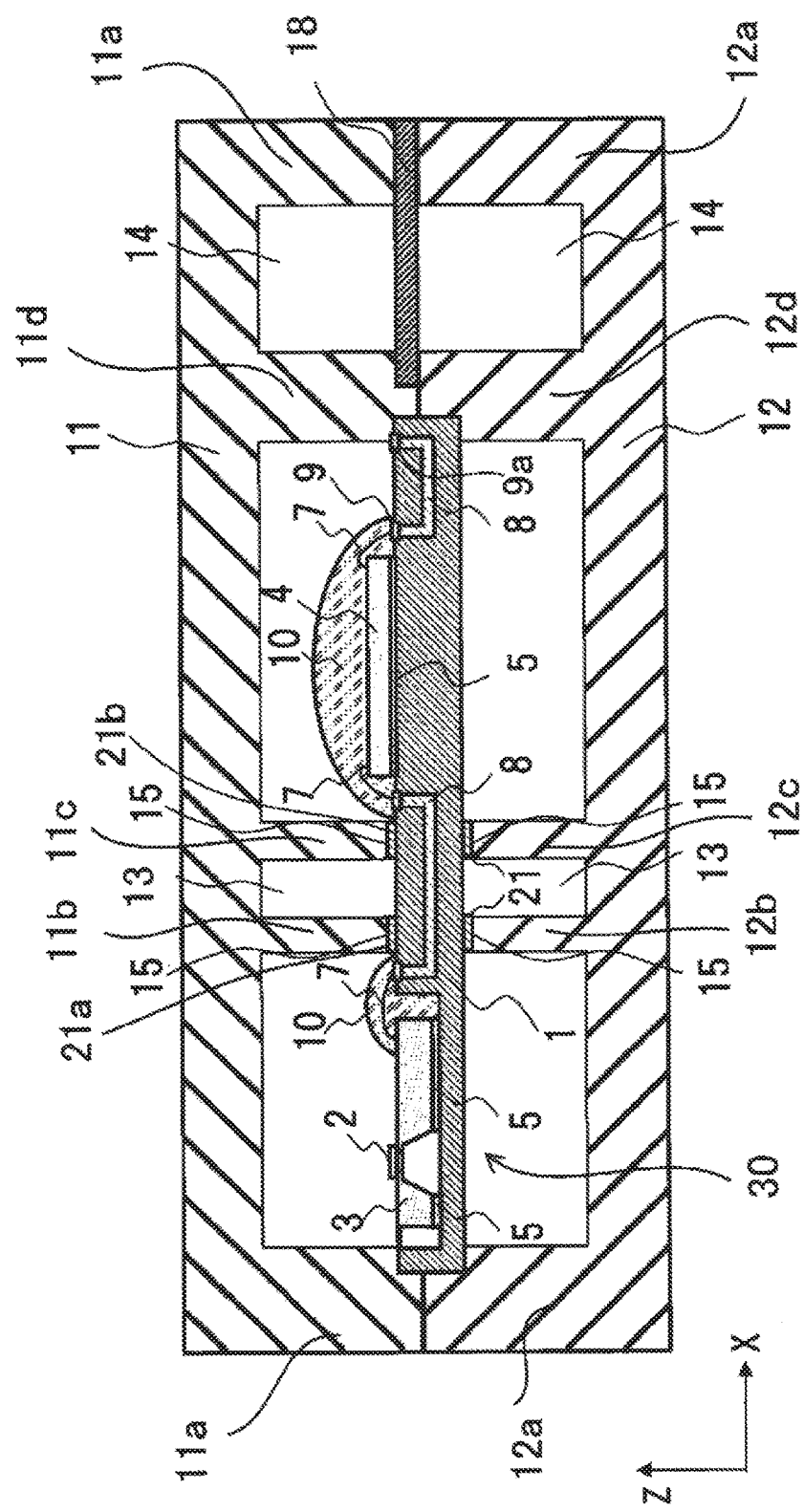
FIG. 3 is a cross-sectional view indicating a state in which the circuit module illustrated in FIG. 1 is insert-molded.

FIG. 3 is a cross-sectional view indicating a state in which the circuit module 30 illustrated in FIG. 1 is insert-molded.

FIG. 4 is a plan view of a resin molding immediately after insert-molding the circuit module 30 illustrated in FIG. 1.

As described above, the circuit module 30 and a plurality of connector leads 18 are insert products, and the insert products and the resin 50 are integrated in the sensor device 100.

A storage unit to store the circuit module 30 and a plurality of the connector leads 18 are formed in the upper mold 11 and the lower mold 12. The circuit module 30 and a plurality of the connector leads 18 are stored in the storage unit of the lower mold 12, and the upper mold 11 is closed. Partition walls 11b, 11c, 11d, 12b, 12c, and 12d disposed on the outer peripheral side walls 11a and 12a and the resin leakage suppression layer 21 are formed in each of the upper mold 11 and the lower mold 12. A clamp portion 15 is provided on a contact surface between each of the partition walls 11b, 11c, 12b, and 12c and the circuit board 1. However, as described later, depending on the thickness of the circuit board 1, the clamp portion 15 does not contact the circuit board 1.

Each of the partition walls 11b and 11c of the upper mold 11 is formed at a position corresponding to the resin leakage suppression layer 21. Each of the partition walls 12b and 12c of the lower mold 12 is formed at a position corresponding to the partition walls 11b and 11c of the upper mold 11. The partition walls 11d and 12d are for partitioning the input/output pad 9a of the circuit board 1 and the connector leads 18. A hollow portion 13 is formed between the partition walls 11b and 12b of the upper mold 11 and the lower mold 12 and the partition walls 11c and 12c. A hollow portion 14 is formed between the partition walls 11d and 12d of the upper mold 11 and the lower mold 12 and the outer peripheral side walls 11a and 12a on the rear end side in the X direction of the upper mold 11 and the lower mold 12. Incidentally, the input/output pad 9a is covered with the partition wall 11d of the upper mold 11.

In the state illustrated in FIG. 3, a molten resin 50a (refer to FIG. 6) is injected into the hollow portions 13 and 14 of the upper mold 11 and the lower mold 12 to fill the inside of the hollow portions 13 and 14. Insert-molding is performed using the circuit module 30 and a plurality of the connector leads 18 as insert products. In this manner, the molten resin 50a is cured, and the resin molding is formed in which the front wall portion 51 and a pair of intermediate wall portions 53 of the resin 50 and the circuit board 1 are adhered and integrated.

Incidentally, in insert molding, the insert product and the resin are integrated without a bonding mechanism or integrated with a bonding mechanism. Integration without a bonding mechanism is a structure in which an insert product is held with resin, in other words, sandwiched by resin. Integration with a bonding mechanism is a structure in which an adhesive layer is provided between the insert product and the resin, or the insert product and the resin are chemically bonded to each other. In the present description, the term "the circuit board 1 and the resin 50 are adhered" includes the structure with a bonding mechanism and the structure without a bonding mechanism.

FIG. 4 indicates a state in which the circuit module 30 is removed from the upper mold 11 and the lower mold 12 after the resin 50 is formed.

In the circuit board 1, the rectangular frame-like resin 50 having the front wall portion 51, the rear wall portion 52, and a pair of the intermediate wall portions 53 is integrated. On the rear wall portion 52, a plurality of the connector leads 18 is integrated.

Then, the input/output pad 9a of the circuit board 1 and the connector lead 18 are connected by a wire 17. The wire 17 can be formed by wire bonding.

Then, an upper cover 54 and a lower cover 55 are bonded to each of front and back surfaces of the resin 50. In this manner, the sensor device 100 illustrated in FIG. 5 is obtained.

In FIG. 3, to prevent resin leakage in the process of injecting the molten resin 50a into the hollow portions 13 and 14 of the upper mold 11 and the lower mold 12, the clamp portions 15 provided on each of the partition walls 11b, 11c, 12b, and 12c must be brought into contact with the circuit board 1. However, since the thickness of the circuit board 1 varies, when the circuit board 1 is thin, a gap is generated between the circuit board 1 and the clamp portion 15 in a state where the upper mold 11 and the lower mold 12 are clamped. In particular, when a multilayer wiring board is used as the circuit board 1, the wiring boards of each layer are further varied, and the entire thickness may be further varied in some cases. Resin may leak if a gap is generated between the circuit board 1 and the clamp portion 15 as the thickness of the circuit board 1 varies in a thin side.

Figure 6A:
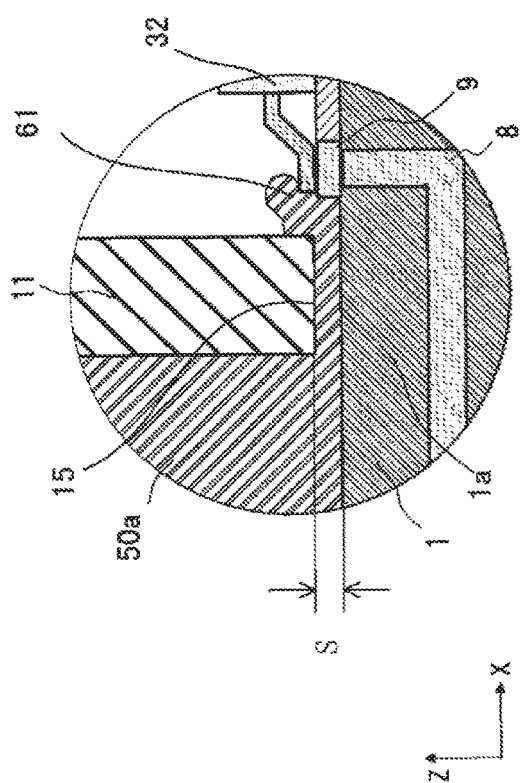
FIGS. 6A and 6B are views describing suppression operation of resin leakage.
Figure 6B:
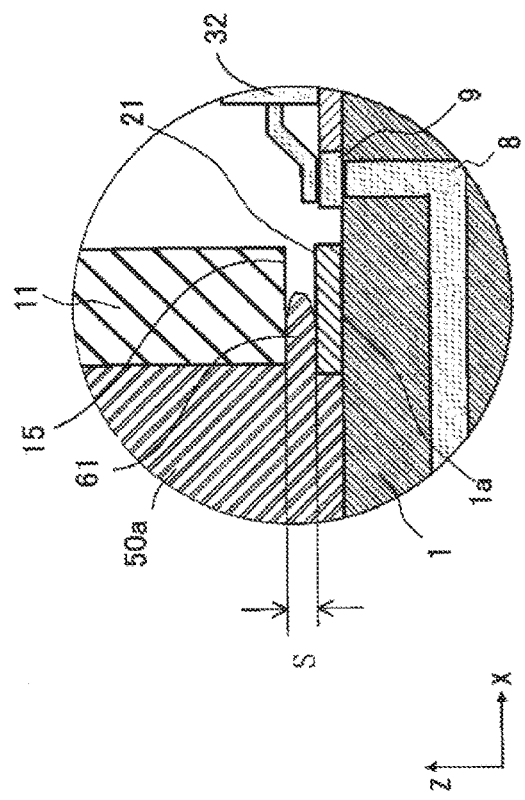

FIG. 6 is views for describing suppression operation of resin leakage. FIG. 6(A) is a view indicating a structure having a resin leakage suppression layer according to the present invention. FIG. 6(B) is a view indicating a conventional resin molding which does not include a resin leakage suppression layer.

In the conventional structure illustrated in FIG. 6(B), one surface 1a of the circuit board 1 directly faces the clamp portion 15. Since the circuit board 1 is formed of a material with low thermal conductivity, a cooling speed of the temperature of the molten resin 50a is slow. Therefore, it takes time to cure the molten resin 50a leaking from a gap S between one surface 1a of the circuit board 1 and the clamp portion 15, and the amount of the leakage resin 61 increases. When the thickness of the leakage resin 61 becomes thicker than the gap S, and a load due to shrinkage of the leakage resin 61 increases, the circuit board 1 is deformed. In addition, the leakage resin 61 may cover the electronic component 32 mounted on the circuit board 1, and pressure may be applied to the electronic component 32. As described above, when the circuit board 1 is deformed by the leakage resin 61 or the pressure is applied to the mounted electronic component 32, the performance of the sensor device 100 is affected.

On the other hand, the structure illustrated in FIG. 6(A) is used in the first embodiment of the present invention. That is, the resin leakage suppression layer 21 is formed along each side surface of the circuit board 1, on which the resin 50 is formed. The gap S between the resin leakage suppression layer 21 and the clamp portion 15 is set to be equal to the variation amount of the circuit board 1. The resin leakage suppression layer 21 is formed of a base material having a thermal conductivity higher than a thermal conductivity of the base material of the circuit board 1. Therefore, the molten resin 50a leaking from the gap S between the resin leakage suppression layer 21 and the clamp portion 15 is immediately cooled and solidified by the resin leakage suppression layer 21. Thereby, the amount of the leakage resin 61 is reduced. If a formation range of the resin leakage suppression layer 21 is made wider than the resin leakage region, a cooling effect of the resin is increased, and a suppression effect of the leakage resin 61 can be increased.

The resin leakage suppression layer 21 is formed of a thermosetting resin such as an epoxy resin or a phenol resin mixed with fine particles made of a metal such as iron and copper, a ceramic such as aluminum nitride and alumina, or a high thermal conductive material such as carbon, or a thermoplastic resin such as polycarbonate or polyethylene terephthalate can be used. To prevent the molten resin 50a from directly coming into contact with the circuit board 1, preferably, the resin leakage suppression layer 21 is formed at a position where end portions on the side of the front wall portion 51 and the intermediate wall portion 53 overlap the front wall portion 51 and the intermediate wall portion 53. Further, it is preferable that the resin leakage suppression layer 21 is formed over a wider range than the region where the leakage resin 61 is formed.

According to the first embodiment, the following effects are obtained.

(1) A resin leakage suppression layer 21 including a material having a higher thermal conductivity than a thermal conductivity of a base material of the circuit board 1 is provided in at least an edge region along a portion adhered to the resin 50 on the circuit board 1. Therefore, the molten resin 50a leaking from the gap S between the resin leakage suppression layer 21 and the clamp portion 15 of the upper mold 11 are immediately cooled and solidified, and the leakage resin 61 can be reduced.

(2) The sensor device 100 according to the first embodiment can be obtained by adding, to general insert molding, the process of forming the resin leakage suppression layer 21 at a position corresponding to the clamp portion 15 of the upper mold 11 and the lower mold 12 in the circuit board 1. Therefore, it is possible to perform insert molding using the circuit board 1 as an insert product without any restriction on such as a shape of the resin 50 and to improve a throughput.

(3) The resin leakage suppression layer 21 provided between the circuit board 1 and the leakage resin 61 is provided in a wider range than the leakage resin 61. Therefore, the effect of reducing the leakage resin 61 can be increased.

If a multilayer wiring board having large variations in thickness is used as the circuit board 1, an effect of improving the reliability can be enhanced with a suppression effect of the leakage resin 61.

—Second Embodimen—

Figure 7:
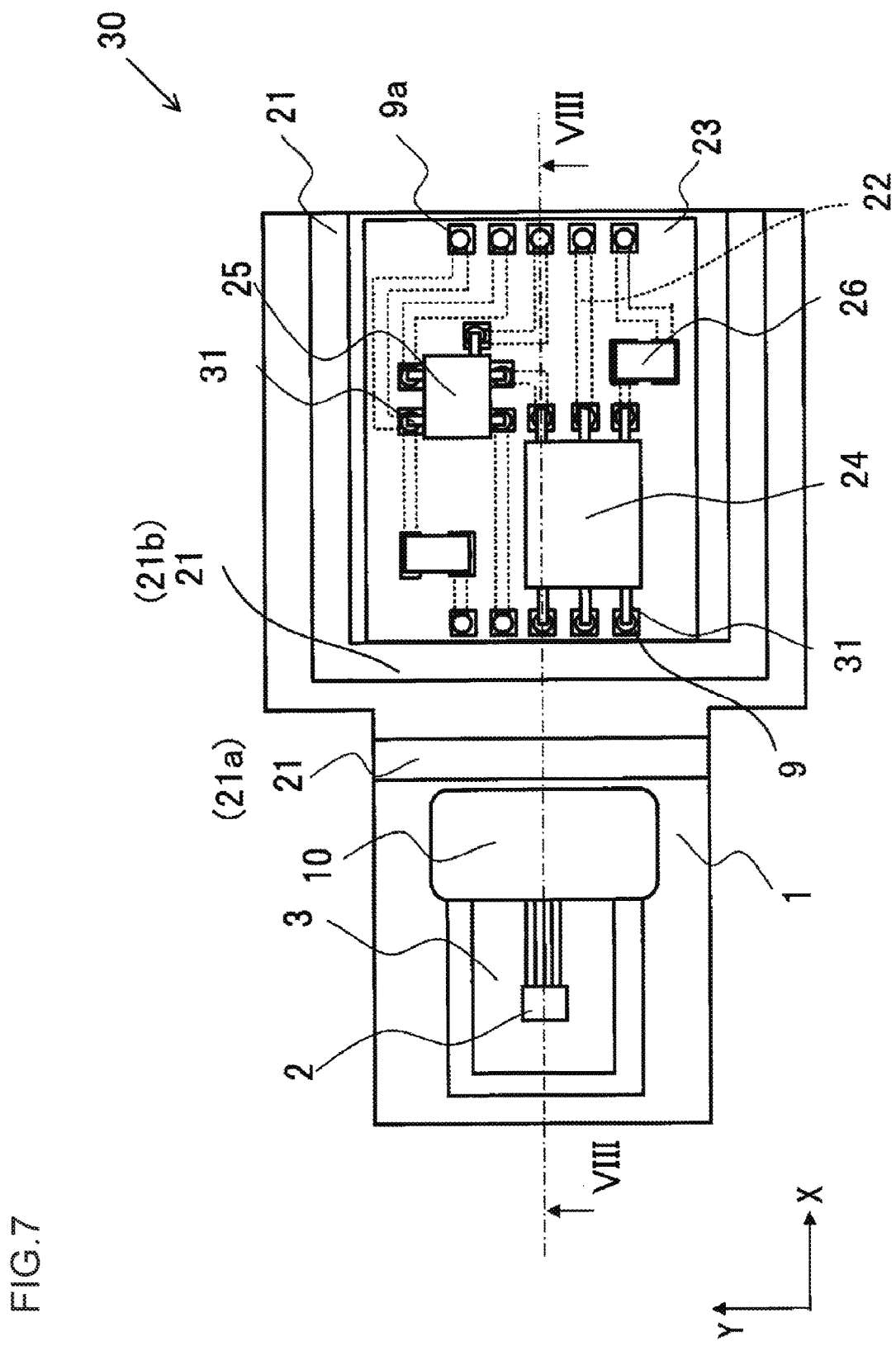
FIG. 7 is a plan view of a circuit module of a sensor device according to a second embodiment of the present invention.
Figure 8:
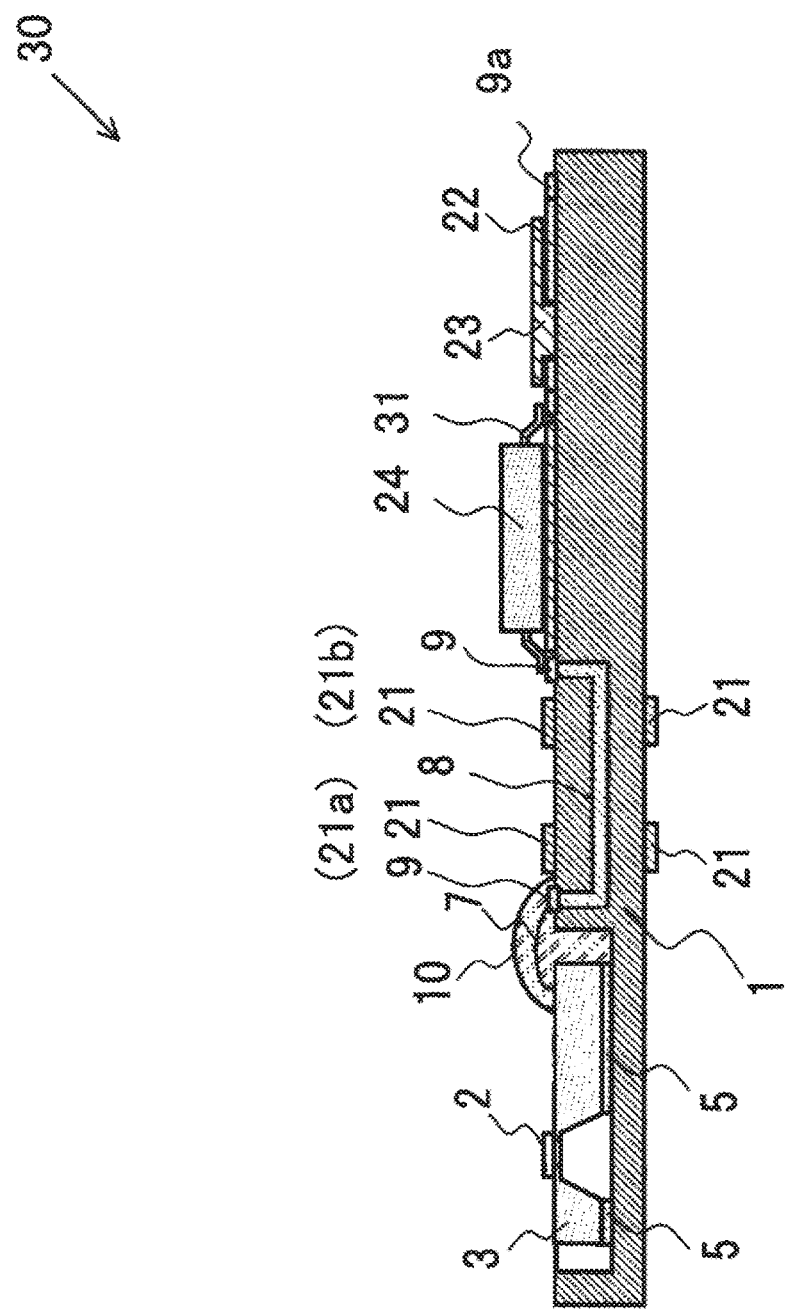
FIG. 8 is a cross-sectional view taken along line VIII-VIII of the circuit module illustrated in FIG. 7.
Figure 9:
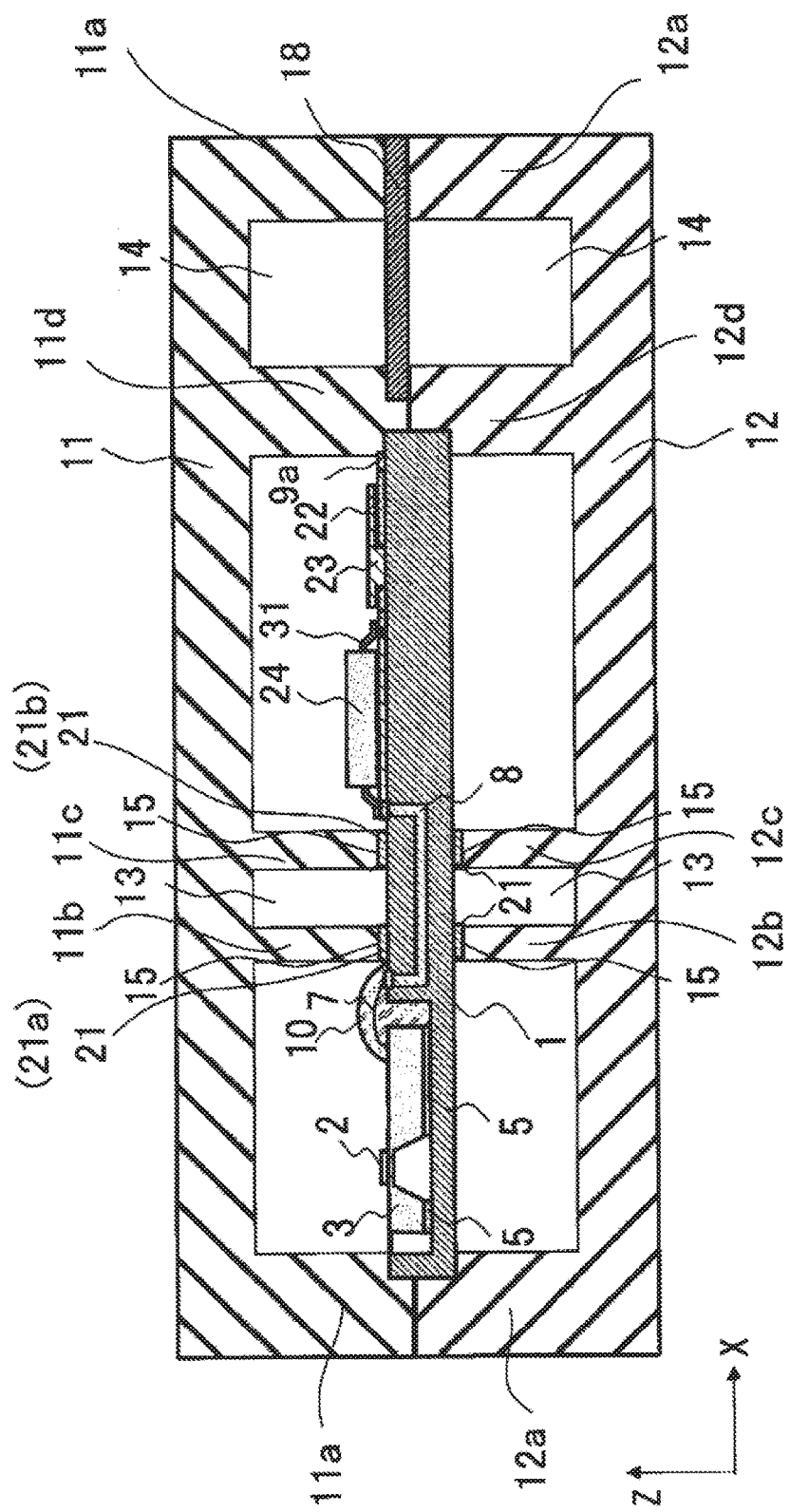
FIG. 9 is a cross-sectional view indicating a state in which the circuit module illustrated in FIG. 7 is insert-molded.

FIG. 7 is a plan view of a circuit module of a sensor device according to a second embodiment of the present invention, and FIG. 8 is a sectional view taken along line VIII-VIII of the circuit module illustrated in FIG. 7. FIG. 9 is a cross-sectional view indicating a state in which the circuit module illustrated in FIG. 7 is insert-molded.

The second embodiment is different from the first embodiment in that a second semiconductor element 24 and an input/output pad 9a are connected by an outer layer wiring 22.

In the second embodiment, a resin-sealed flat package such as dual flat package (DFP) or quad flat package (QFP) is used as the second semiconductor element 24 mounted on the circuit board 1. In place of the inner layer wiring 8 which connects the second semiconductor element 4 and the input/output pad 9a according to the first embodiment, the outer layer wiring 22 is formed on an upper surface of the circuit board 1 in the second embodiment. One end of the outer layer wiring 22 is connected to the input/output pad 9a.

In the second embodiment, the second semiconductor element 24, a third semiconductor element 25, and other electronic components 26 are mounted on the circuit board 1. The second semiconductor element 24 and the third semiconductor element 25 are mounted with leads 31 bonded to pads 9. Further, the other electronic component 26 is mounted with a terminal unit (not illustrated) bonded to the pad 9. The outer layer wiring 22 is disposed on an upper surface of the circuit board 1 as indicated by dotted lines in FIG. 7 and connects the second semiconductor element 24 and the third semiconductor element 25 and the other electronic component 26 via the pad 9. The outer layer wiring 22 is covered with a protective resist 23. However, the pads 9 and 9a are exposed from the protective resist 23.

Base metals such as copper are inexpensive. However, those are easily corroded when used as an outer layer wiring. Therefore, the pads 9 and 9a are exposed, and the entire outer layer wiring 22 is covered with the protective resist 23. After the outer layer wiring 22 is entirely covered with the protective resist 23, the second semiconductor element 24, the third semiconductor element 25, and the other electronic component 26 are bonded to the pad 9. By this procedure, the protective resist 23 can be efficiently provided on the upper surface of the circuit board 1.

Insert-molding between the circuit module 30 and the connector lead 18 and the resin 50 is performed in a state where the second semiconductor element 24, the third semiconductor element 25, and the other electronic component 26 are mounted on the circuit board 1 as illustrated in FIG. 9.

In the second embodiment, the protective resist 23 may be formed of the same material as the resin leakage suppression layer 21. If the protective resist 23 is made of the same material as the resin leakage suppression layer 21, the formation of the protective resist 23 can be performed in the same process as formation of the resin leakage suppression layer 21, and the number of processes can be reduced.

Other configurations of the second embodiment are the same as those of the first embodiment, and corresponding members are denoted by the same reference signs, and description thereof is omitted.

Also in the second embodiment, the same effects as in the first embodiment are obtained.

—Third Embodiment—

Figure 10:
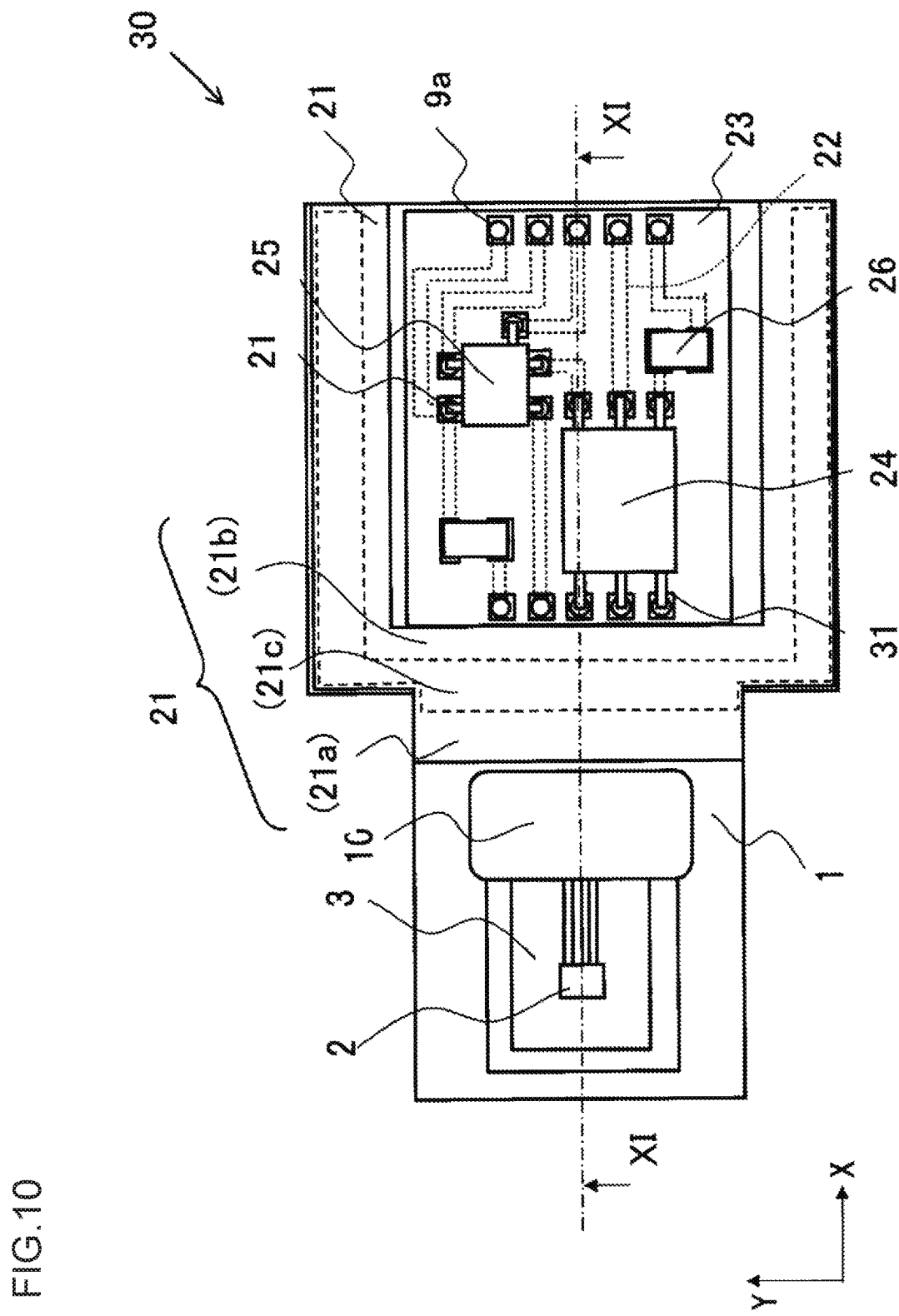
FIG. 10 is a plan view of a circuit module of a sensor device according to a third embodiment of the present invention.
Figure 11:
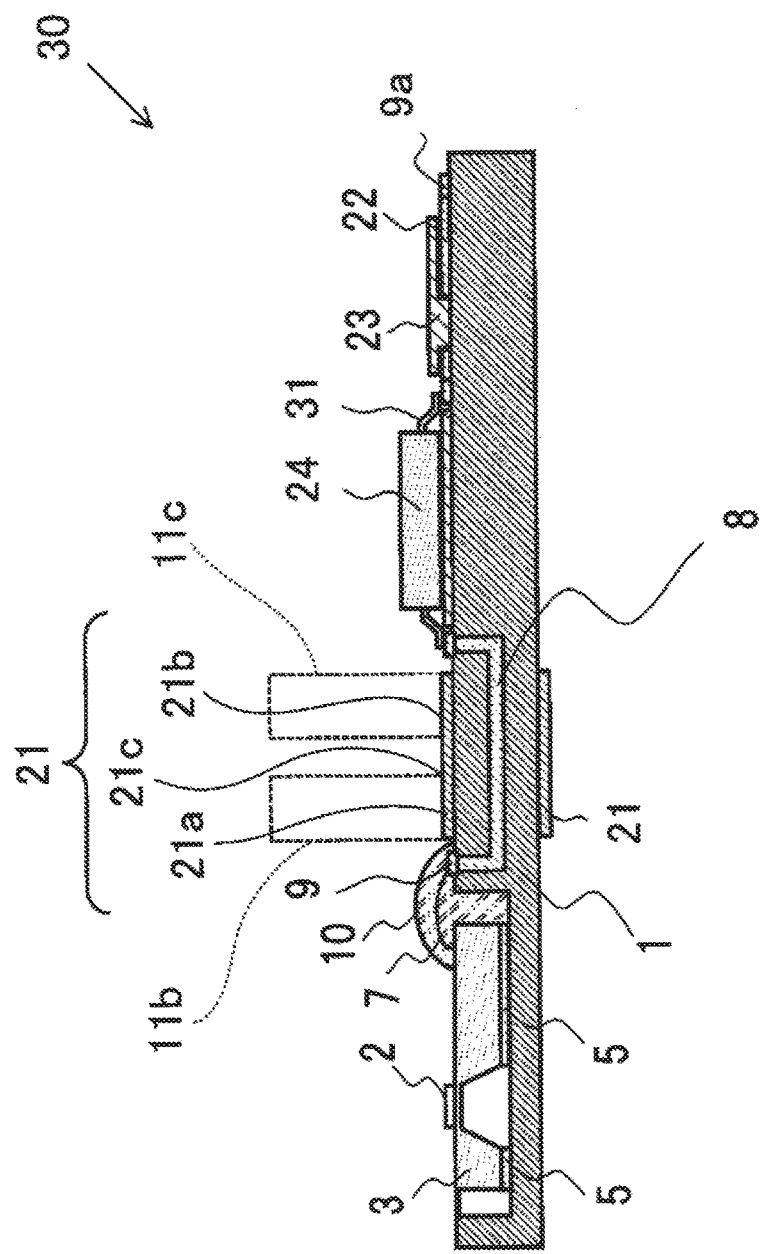
FIG. 11 is a cross-sectional view taken along line XI-XI of the circuit module illustrated in FIG. 10.
Figure 12:
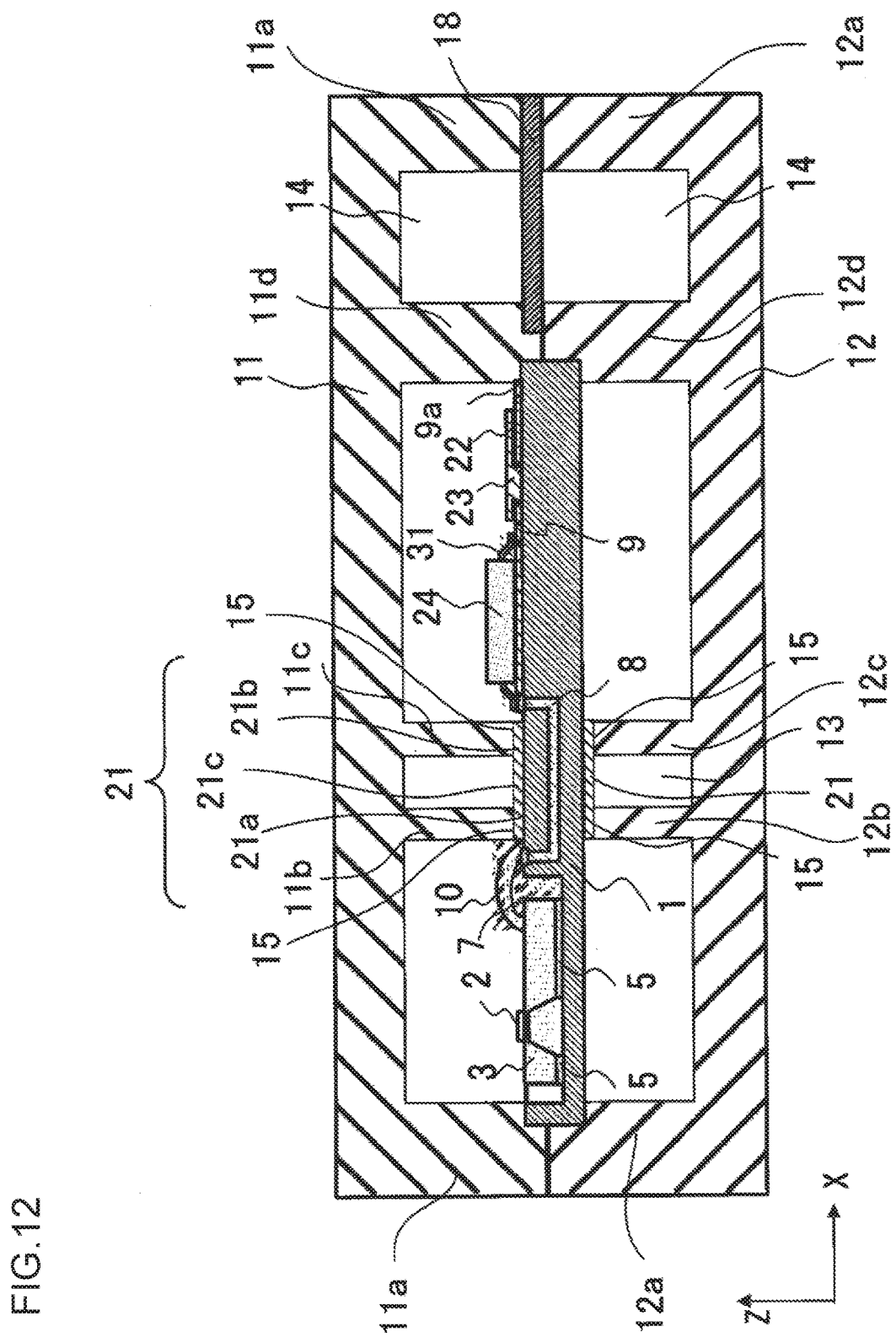
FIG. 12 is a cross-sectional view indicating a state in which the circuit module illustrated in FIG. 10 is insert-molded.
Figure 13:
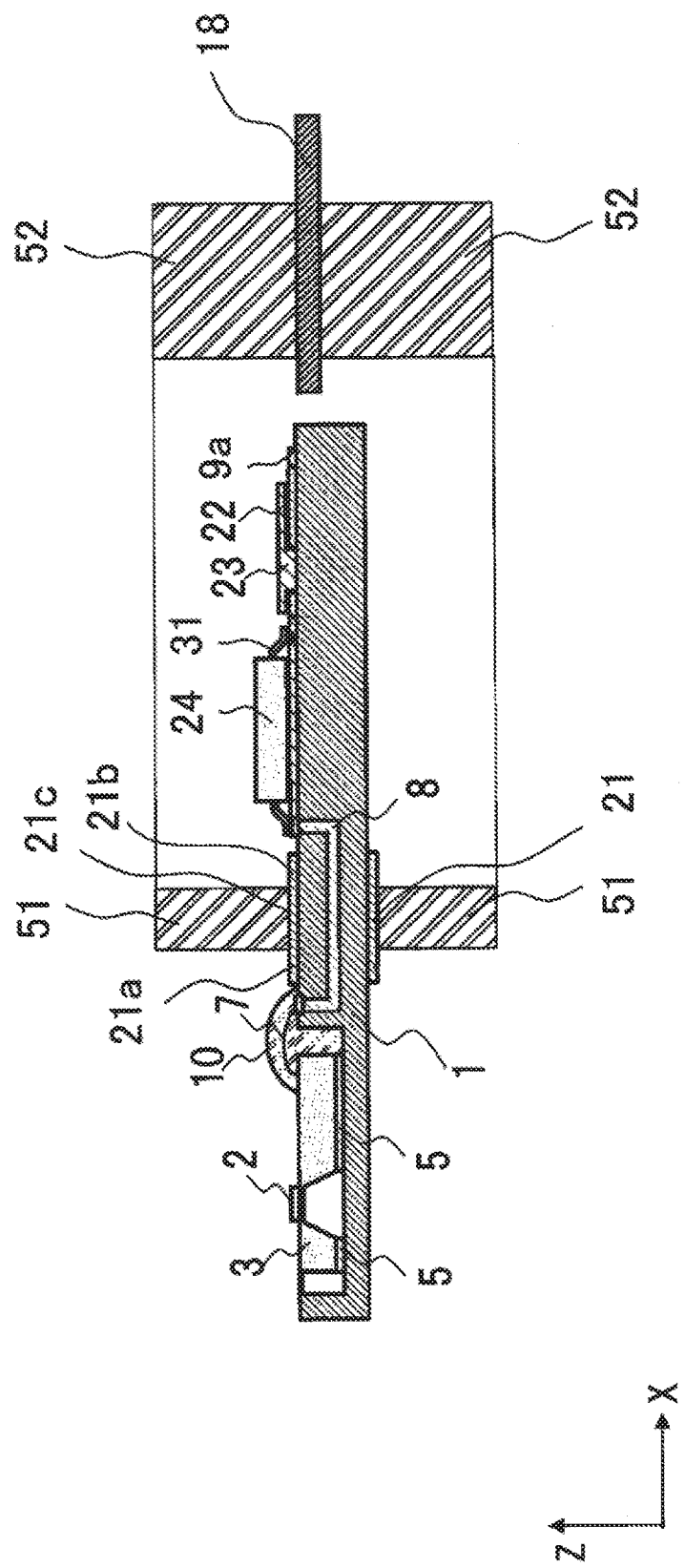
FIG. 13 is a cross-sectional view of a resin molding immediately after the circuit module illustrated in FIG. 12 is insert-molded.

FIG. 10 is a plan view of a circuit module of a sensor device according to a third embodiment of the present invention. FIG. 11 is a cross-sectional view taken along line XI-XI of the circuit module illustrated in FIG. 10. FIG. 12 is a cross-sectional view indicating a state where the circuit module illustrated in FIG. 10 is insert-molded. FIG. 13 is a cross-sectional view of a resin molding immediately after the circuit module illustrated in FIG. 12 is insert-molded.

The third embodiment is different from the second embodiment in that a resin leakage suppression layer 21 is also provided between an outer edge portion 21a and an inner edge portion 21b, and the outer edge portion 21a and the inner edge portion 21b are integrally connected.

As illustrated in such as FIGS. 10 and 11, the resin leakage suppression layer 21 formed on a circuit board 1 has a structure in which the outer edge portion 21a, the inner edge portion 21b, and an intermediate portion 21c connecting the outer edge portion 21a and the inner edge portion 21b are formed integrally with each other. In FIG. 11, partition walls 11b and 11c of an upper mold 11 are indicated by dotted lines.

Other configurations of the third embodiment are the same as those of the first embodiment, and corresponding members are denoted by the same reference signs, and description thereof is omitted.

Also in the third embodiment, the same effect as in the first embodiment is obtained.

In the third embodiment as well, insert-molding is performed as in the first and second embodiments. In the third embodiment, as illustrated in FIG. 12, the resin leakage suppression layer 21 is provided across the partition wall 11*b* and the partition wall 11*c* of the upper mold 11 and the lower mold 12. Therefore, there is no need to precisely position the resin leakage suppression layer 21 corresponding to a clamp portion 15. As a result, productivity is improved, and yield can be improved. Further, before a molten resin 50*a* leaks from the outer edge portion 21*a* side of the resin leakage suppression layer 21 or the inner edge portion 21*b* side of the resin leakage suppression layer 21, the molten resin 50*a* is cooled by contacting the intermediate portion 21*c* of the resin leakage suppression layer 21, the amount of a leakage resin 61 can be reduced or eliminated.

—Fourth Embodiment—

Figure 14:
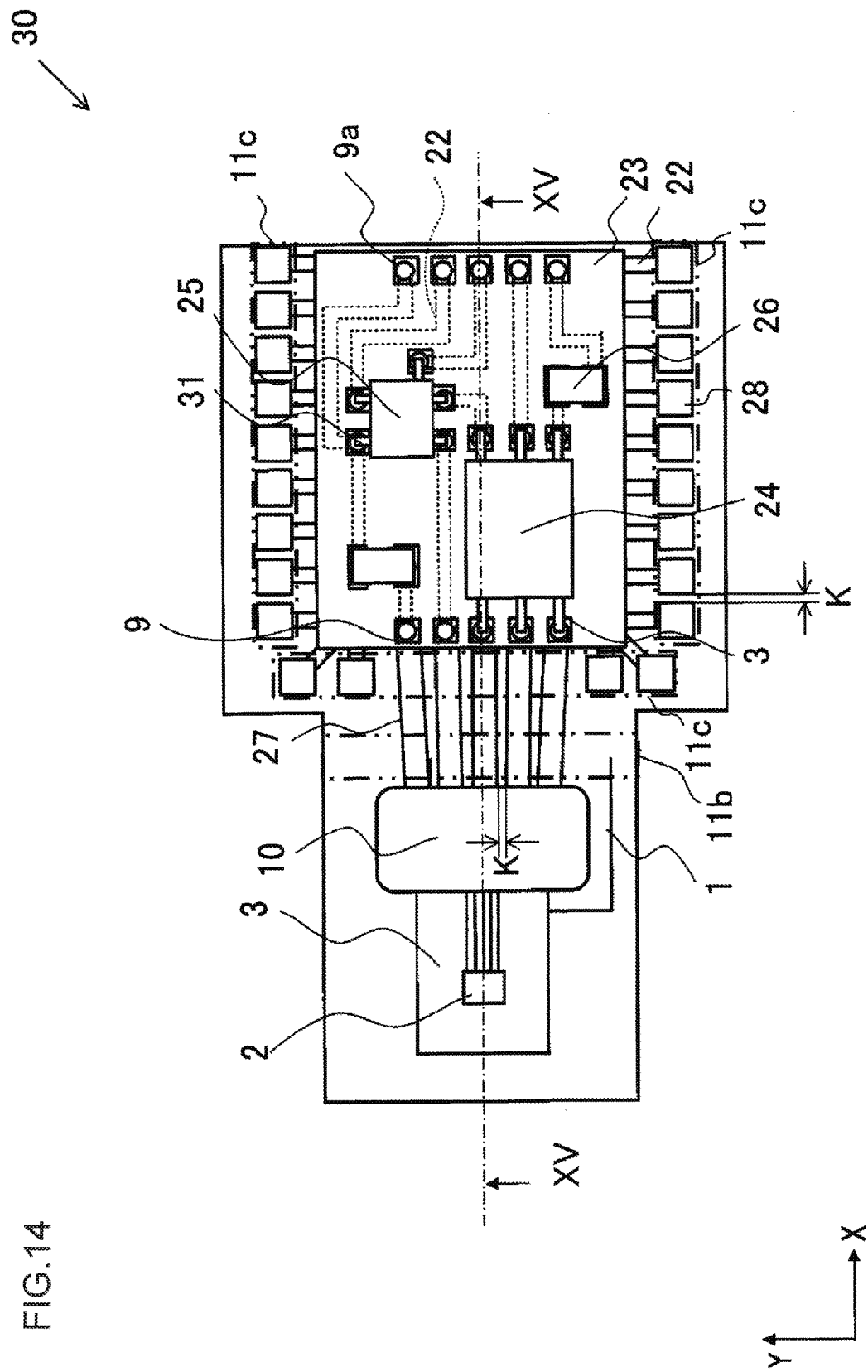
FIG. 14 is a plan view of a circuit module of a sensor device according to a fourth embodiment of the present invention.
Figure 15:
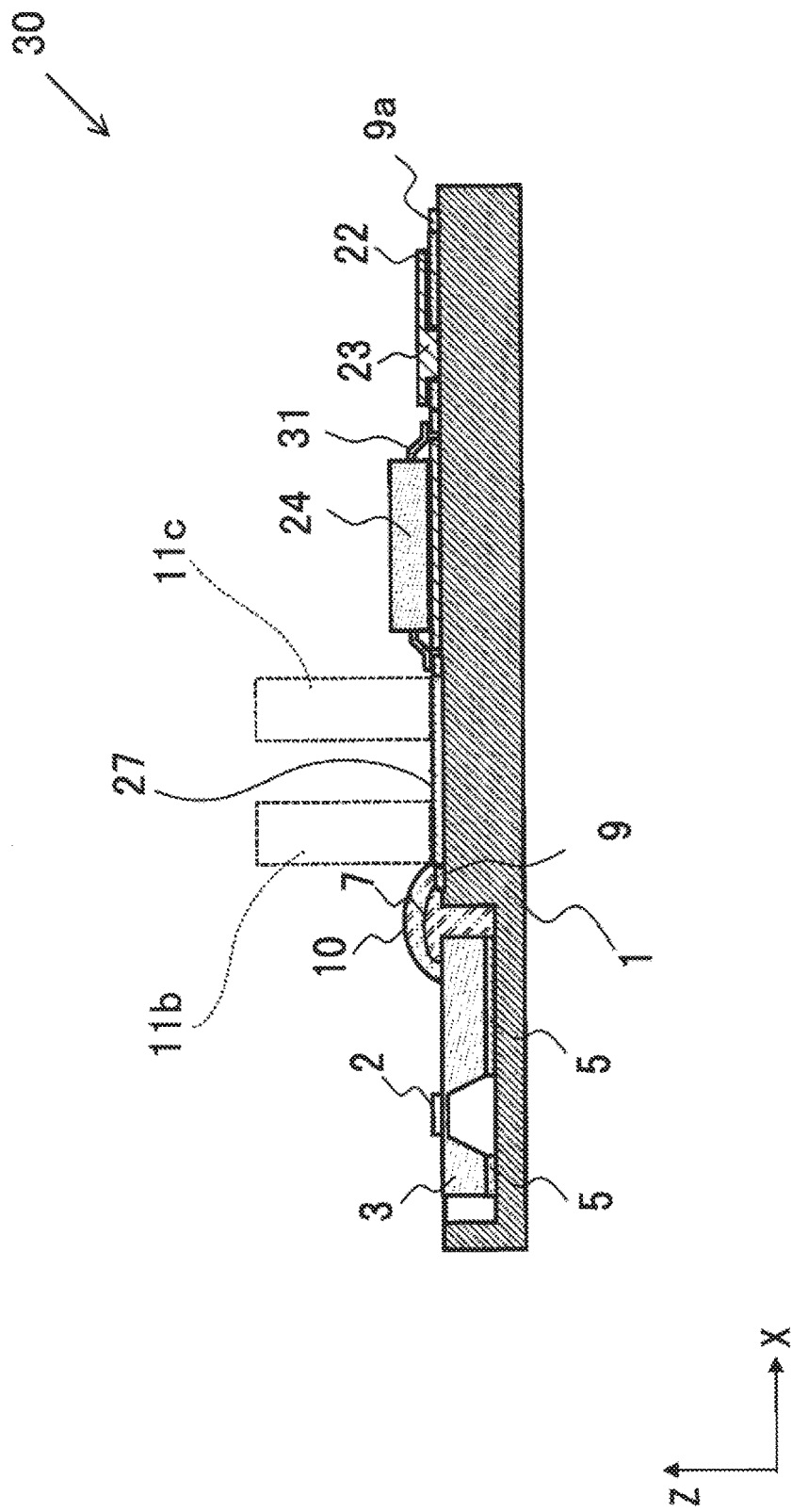
FIG. 15 is a cross-sectional view taken along line XV-XV of the circuit module illustrated in FIG. 14.
Figure 16:
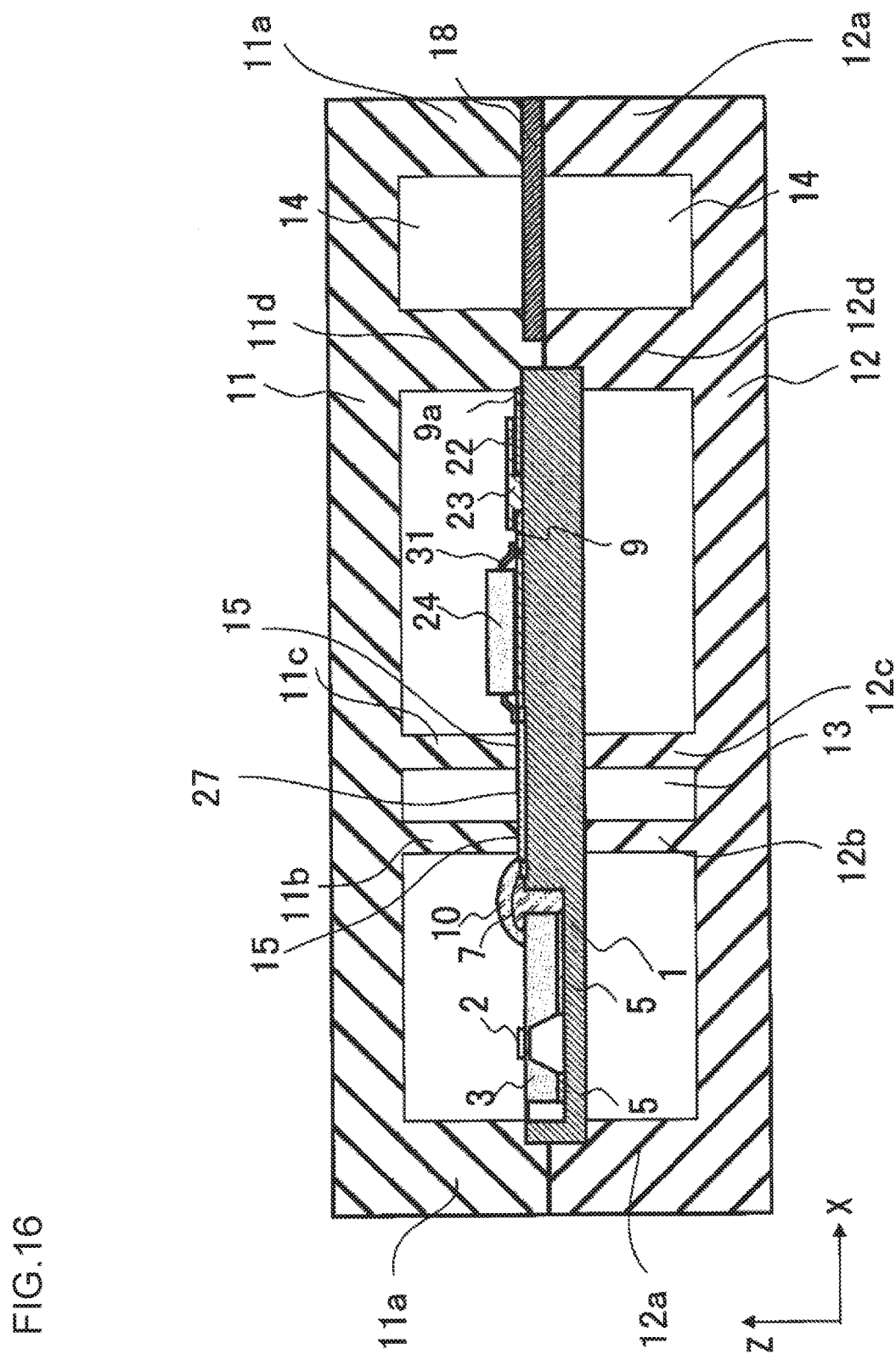
FIG. 16 is a cross-sectional view indicating a state in which the circuit module illustrated in FIG. 14 is insert-molded.
Figure 17:
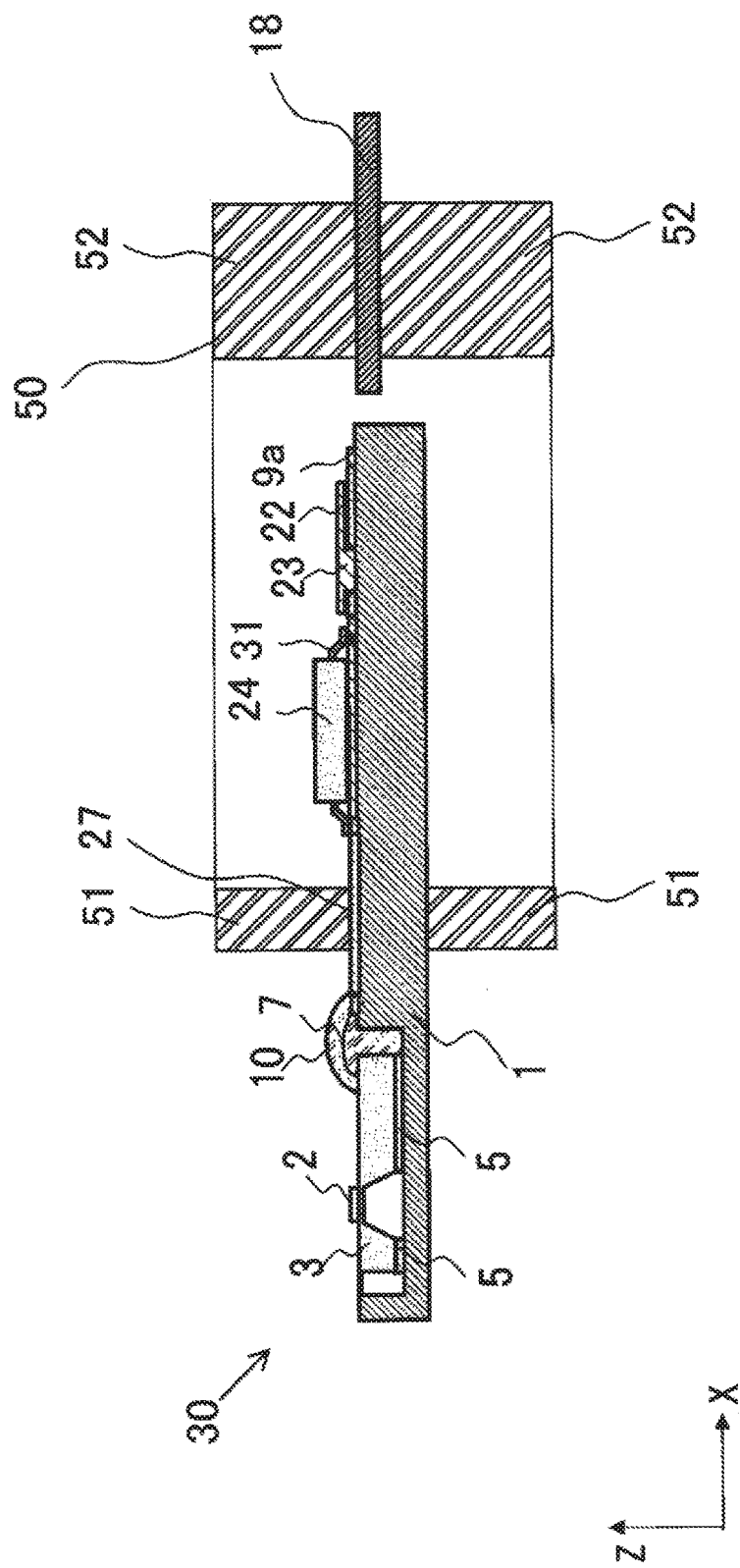
FIG. 17 is a cross-sectional view of a resin molding immediately after the circuit module illustrated in FIG. 14 is insert-molded.

FIG. 14 is a plan view of a circuit module of a sensor device according to a fourth embodiment of the present invention. FIG. 15 is a cross-sectional view taken along line XV-XV of the circuit module illustrated in FIG. 14. FIG. 16 is a cross-sectional view indicating a state where the circuit module illustrated in FIG. 14 is insert-molded. FIG. 17 is a cross-sectional view of a resin molding immediately after the circuit module illustrated in FIG. 14 is insert-molded. The fourth embodiment is different from the third embodiment in that, instead of the inner layer wiring 8 and the resin leakage suppression layer 21, an outer layer wiring 27 or a pad-like conductor 28 which functions also as a resin leakage suppression layer is provided.

As illustrated in FIGS. 14 and 15, a pad 9 to which a wire 7 is connected and a pad 9 to which a second semiconductor element 24 is connected are connected by the outer layer wiring 27. A plurality of the outer layer wirings 27 formed of, for example, a metal conductor such as copper is disposed. As with the resin leakage suppression layer 21 according to the third embodiment, each of the outer layer wirings 27 has a length in which an outer edge portion, an inner edge portion, and an intermediate portion are integrally formed and provided across partition walls 11*b* and 11*c* of an upper mold 11 and a lower mold 12. That is, a plurality of the outer layer wirings 27 is disposed so as to cross portions adhered to a front wall portion 51 of a resin 50 while being separated from each other.

As illustrated in FIG. 14, a plurality of the pad-like conductors 28 is disposed along inner side surfaces 53*a* (refer to FIG. 4) of an inner side surface 51*b* of the front wall portion 51 of the resin 50 and a pair of intermediate wall portions 53 of the resin 50. In other words, a plurality of the pad-like conductors 28 is disposed corresponding to the partition portion 11*c* of the upper mold 11 indicated by a two-dot chain line. However, the pad-like conductor 28 is not formed in a region where the outer layer wiring 27 extends. Each of the pad-like conductors 28 is formed of a metal conductor such as copper and is connected to an outer layer wiring 22. The outer layer wiring 27 and the pad-like conductor 28 formed of a metal conductor have higher thermal conductivity than that of a base material of a circuit board 1. Therefore, the amount of a leakage resin 61 can be reduced.

The outer layer wiring 27 and the pad-like conductor 28 have a gap K between the outer layer wiring 27 and the pad-like conductor 28 adjacent to the outer layer wiring 27 or the pad-like conductor 28 in the arrangement direction. However, since a molten resin 50*a* is cooled on an upper surface and a side surface of the outer layer wiring 27 or the pad-like conductor 28, there is an effect of reducing the molten resin 50*a* leaking from the gap K. However, it is desirable not to significantly enlarge the gap K. As an example, when a gap S between an upper surface of the outer layer wiring 27 or the pad-like conductor 28 and a lower surface of a clamp portion 15 is about 0.75 mm, the gap K can be set to about several tens μm to several hundred μm. However, this is indicated for reference, and the gap K varies depending on the gap S between the resin leakage suppression layer 21 and the clamp portion 15 and such as a material, an area, and a shape of the outer layer wiring 27 and the pad-like conductor 28.

Other configurations of the fourth embodiment are the same as those of the third embodiment, and corresponding members are denoted by the same reference signs, and description thereof is omitted.

In the fourth embodiment, also, the same effect as in the third embodiment is obtained.

Further, in the fourth embodiment, since the outer layer wiring 27 or the pad-like conductor 28 also functions as the resin leakage suppression layer, the number of processes can be reduced.

In the fourth embodiment, an inner layer wiring 8 may be provided instead of the outer layer wiring 27 to include only the pad-like conductor 28. Further, the pad-like conductor 28 may be elongated so as to be connected to only one or two outer layer wirings 22.

—Fifth Embodiment—

Figure 18:
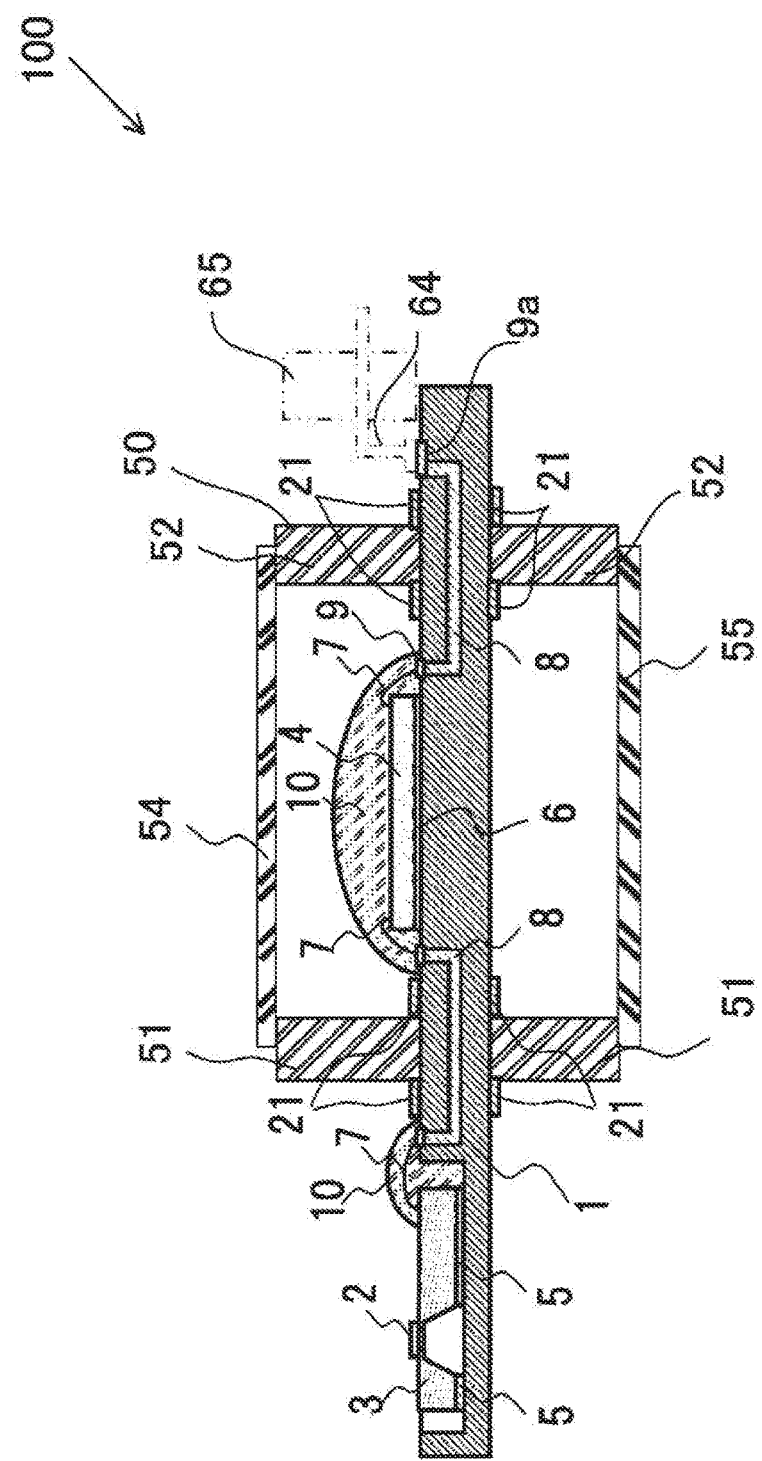
FIG. 18 is a cross-sectional view of a sensor device according to a fifth embodiment of the present invention.

FIG. 18 is a sectional view of a sensor device according to a fifth embodiment of the present invention.

The fifth embodiment is different from the first embodiment in that a connector lead is not insert-molded.

As illustrated in FIG. 18, a resin 50 in a rectangular frame shape having a front wall portion 51, a rear wall portion 52, and a pair of intermediate wall portions 53 (not illustrated in FIG. 18) is integrated with a circuit board 1 in a region of the circuit board 1. A resin leakage suppression layer 21 is formed along inner and outer side surfaces of each of the front wall portion 51 and the rear wall portion 52. Although not illustrated, the resin leakage suppression layer 21 is also formed along a pair of the intermediate wall portions 53.

The input/output pad 9*a* is formed on an upper surface of the circuit board 1 outside the rear wall portion 52 of the resin 50. A connector lead 64 integrated with a connector 65 can be connected to an input/output pad 9*a* as indicated by a two-dot chain line. Connection members other than the connector lead such as a wire and a bus bar can be connected to the input/output pad 9*a*.

Other configurations of the fifth embodiment are the same as those of the first embodiment, and corresponding members are denoted by the same reference signs, and description thereof is omitted.

A structure in which the connector lead indicated in the fifth embodiment is not insert-molded can also be applied to the second to fourth embodiments.

In each of the above embodiments, the sensor device 100 having a flow rate sensor is exemplified. However, the present invention can be applied to a sensor device having a sensor element other than the flow rate sensor. The number of sensor elements is not limited to one, and a plurality of sensor elements may be provided.

Further, the present invention can be applied to a resin molding in which a circuit module on which a semiconductor element other than a sensor element is mounted and a resin are integrated.

In the above-described first to third embodiments, the resin leakage suppression layer 21 is exemplified which is provided on upper and lower surfaces of the circuit board 1. However, the resin leakage suppression layer 21 may be provided on either of the upper surface or the lower surface of the circuit board 1.

In each of the above embodiments, the circuit board 1 is exemplified in which a multilayer wiring board is used. However, the circuit board 1 may be a single layer circuit board. Further, the circuit board 1 may be formed of a base material and a surface layer made of materials different from each other. In that case, the thermal conductivity of the resin leakage suppression layers 21 and 27 and the pad-like conductor 28 may be higher than the thermal conductivity of the material of the surface layer of the circuit board 1.

Although various embodiments and modifications have been described above, the present invention is not limited to these contents. The embodiments described above may be combined, and further other embodiments within technical ideas of the present invention are also included within the scope of the present invention.

The disclosure content of the following priority application is incorporated herein as a quotation.

Japanese Patent Application No. 2015 193796 (filed on Sep. 30, 2015)

REFERENCE SIGNS LIST

1 Circuit board
2 Flow rate sensor unit
3 First semiconductor element
4 Second semiconductor element
8 Inner layer wiring
21 Resin leakage suppression layer
21a Outer edge portion
21b Inner edge portion
21c Intermediate portion
22 Outer layer wiring
24 Second semiconductor element
27 Outer layer wiring
28 Pad-like conductor
30 Circuit module
50 Resin
50a Molten resin
51 Front wall portion
51a Outer side surface
51b Inner side surface
52 Rear wall portion
53 Intermediate wall portion
53a Inner side surface
61 Leakage resin
100 Sensor device

The invention claimed is:

1. A resin molding comprising:
a semiconductor element;
a circuit board on which a conductor connected to the semiconductor element is formed; and
a resin adhered and integrated with the circuit board,
wherein a resin leakage suppression layer including a material having a higher thermal conductivity than a thermal conductivity of a material forming a surface layer of the circuit board is provided in an edge region extending along a portion adhered to the resin in the circuit board and extending along at least one-side side surface of the resin; and
wherein the resin leakage suppression layer is formed of a same material as the conductor.

2. The resin molding according to claim 1, wherein the circuit board is formed of a multilayer wiring board.

3. The resin molding according to claim 1, wherein the circuit board is formed of a filler-containing resin.

4. The resin molding according to claim 1, wherein the resin contains a thermoplastic resin.

5. The resin molding according to claim 1, wherein the resin leakage suppression layer is provided between a resin leakage portion and the circuit board in a wider area than the resin leakage portion.

6. The resin molding according to claim 1, wherein the resin leakage suppression layer is also provided in a portion adhered to the resin in the circuit board.

7. The resin molding according to claim 1, wherein the resin leakage suppression layer is connected to the conductor.

8. The resin molding according to claim 1, wherein the resin leakage suppression layer includes pad-like conductors arranged while being separated from each other in the edge region along a portion adhered to the resin in the circuit board.

9. The resin molding according to claim 1, comprising a plurality of the conductors connected to the semiconductor element, wherein the conductors are arranged across the portion adhered to the resin in the circuit board while being separated from each other, and the conductors also function as the resin leakage suppression layer.

10. The resin molding according to claim 1, wherein the circuit board and the resin are insert-molded, and the circuit board is integrated as an insert product.

11. A sensor device comprising the resin molding according to claim 1, wherein the semiconductor element is a sensor element.

12. The sensor device according to claim 11, wherein the sensor element is a flow rate sensor element, and the flow rate sensor element is exposed from the resin.

* * * * *